(12) United States Patent
Laske et al.

(10) Patent No.: US 7,940,106 B2
(45) Date of Patent: May 10, 2011

(54) APPARATUS FOR GENERATING A CORRECTION SIGNAL

(75) Inventors: Christopher Laske, Erlangen (DE); Gerald Ulbricht, Leinburg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 14 days.

(21) Appl. No.: 12/580,984

(22) Filed: Oct. 16, 2009

(65) Prior Publication Data

US 2010/0097134 A1    Apr. 22, 2010

(30) Foreign Application Priority Data

Oct. 17, 2008  (DE) .......................... 10 2008 052 172

(51) Int. Cl.
*H03F 1/26* (2006.01)
(52) U.S. Cl. .......................... 327/309; 327/317; 330/151
(58) Field of Classification Search .................. 327/309, 327/317; 330/149, 151
See application file for complete search history.

(56) References Cited

U.S. PATENT DOCUMENTS

| | | | |
|---|---|---|---|
| 544,864 A | 8/1895 | Olson | |
| 4,291,277 A * | 9/1981 | Davis et al. ................... | 330/149 |
| 4,560,945 A | 12/1985 | Olver | |
| 4,692,996 A * | 9/1987 | Minato ......................... | 438/355 |
| 4,916,407 A | 4/1990 | Olver | |
| 4,926,134 A | 5/1990 | Olver | |
| 4,926,136 A | 5/1990 | Olver | |
| 4,943,783 A * | 7/1990 | Nojima ......................... | 330/149 |
| 5,077,532 A | 12/1991 | Obermann et al. | |
| 5,148,117 A | 9/1992 | Talwar | |
| 5,157,345 A * | 10/1992 | Kenington et al. ........... | 330/149 |
| 5,300,894 A | 4/1994 | Myer et al. | |
| 5,455,537 A | 10/1995 | Larkin et al. | |
| 5,489,875 A | 2/1996 | Cavers | |
| 5,760,646 A | 6/1998 | Belcher et al. | |
| 5,774,018 A | 6/1998 | Gianfortune et al. | |
| 5,789,976 A | 8/1998 | Ghannouchi et al. | |
| 5,862,459 A | 1/1999 | Charas | |
| 5,877,653 A * | 3/1999 | Kim et al. ..................... | 330/149 |
| 5,898,338 A | 4/1999 | Proctor et al. | |
| 5,959,500 A | 9/1999 | Garrido | |
| 6,075,411 A | 6/2000 | Briffa et al. | |

(Continued)

FOREIGN PATENT DOCUMENTS

EP    0411180    2/1991

(Continued)

OTHER PUBLICATIONS

"Building blocks for wideband powerbank for shipboard HF communication systems", Laske, C; Ulbricht, G.; Heuberger, A., London: IET, 2006, ISBN: 0863416591, ISBN: 978 0863416590, pp. 105-109.

*Primary Examiner* — Kenneth B. Wells
(74) *Attorney, Agent, or Firm* — Michael A. Glenn; Glenn Patent Group (57) ABSTRACT

An apparatus for generating a correction signal for linearizing an output signal of a non-linear element includes a correction signal generator. The correction signal generator is configured to generate a correction signal on the basis of a superposition of a digital reference signal and a superposed output signal. The superposed output signal is based on a superposition of the output signal and an analog reference signal.

14 Claims, 6 Drawing Sheets

U.S. PATENT DOCUMENTS

| | | |
|---|---|---|
| 6,078,216 A | 6/2000 | Proctor, Jr. |
| 6,166,601 A | 12/2000 | Shalom et al. |
| 6,188,732 B1 | 2/2001 | Rha |
| 6,266,517 B1 | 7/2001 | Fitzpatrick et al. |
| 6,275,106 B1 | 8/2001 | Gomez |
| 6,359,508 B1 | 3/2002 | Mucenieks |
| 6,392,481 B1 | 5/2002 | Kurttio |
| 6,407,635 B2 | 6/2002 | Mucenieks et al. |
| 6,496,064 B2 | 12/2002 | Rzyski |
| 6,504,428 B2 | 1/2003 | Cova et al. |
| 6,531,918 B1 | 3/2003 | Posner et al. |
| 6,583,739 B1 | 6/2003 | Kenington |
| 6,683,495 B2 | 1/2004 | Johnson et al. |
| 2003/0030490 A1 | 2/2003 | Nanao et al. |
| 2003/0132802 A1 | 7/2003 | Ring et al. |
| 2003/0174017 A1 | 9/2003 | Suto |
| 2003/0184373 A1 | 10/2003 | Cameron et al. |
| 2004/0004516 A1 | 1/2004 | Maniwa |

FOREIGN PATENT DOCUMENTS

| | | |
|---|---|---|
| EP | 0869606 | 10/1998 |
| EP | 0996222 | 4/2000 |
| EP | 1124324 A1 | 8/2001 |
| EP | 1241781 A1 | 9/2002 |
| EP | 1309082 | 5/2003 |
| EP | 1353438 | 10/2003 |
| WO | WO 98/04034 | 1/1998 |
| WO | WO 98/12800 | 3/1998 |
| WO | WO 01/08293 | 2/2001 |
| WO | WO 01/41297 | 6/2001 |
| WO | WO 03/105337 | 3/2003 |

* cited by examiner

APPARATUS FOR GENERATING A CORRECTION SIGNAL

CROSS-REFERENCE TO RELATED APPLICATIONS

This application claims priority from German Patent Application No. 102008052172.8, which was filed on Oct. 17, 2008, and is incorporated herein in its entirety by reference.

BACKGROUND OF THE INVENTION

Embodiments in accordance with the invention relate to an apparatus for generating a correction signal for linearizing an output signal of a non-linear element, and to a method for generating a correction signal for linearizing an output signal of a non-linear element.

Some embodiments in accordance with the invention relate to a method for linearizing using digital signal processing in accordance with the feedforward principle.

By linearizing amplifiers, for example, undesired signal portions generated within the amplifier may be reduced.

Figure 2:
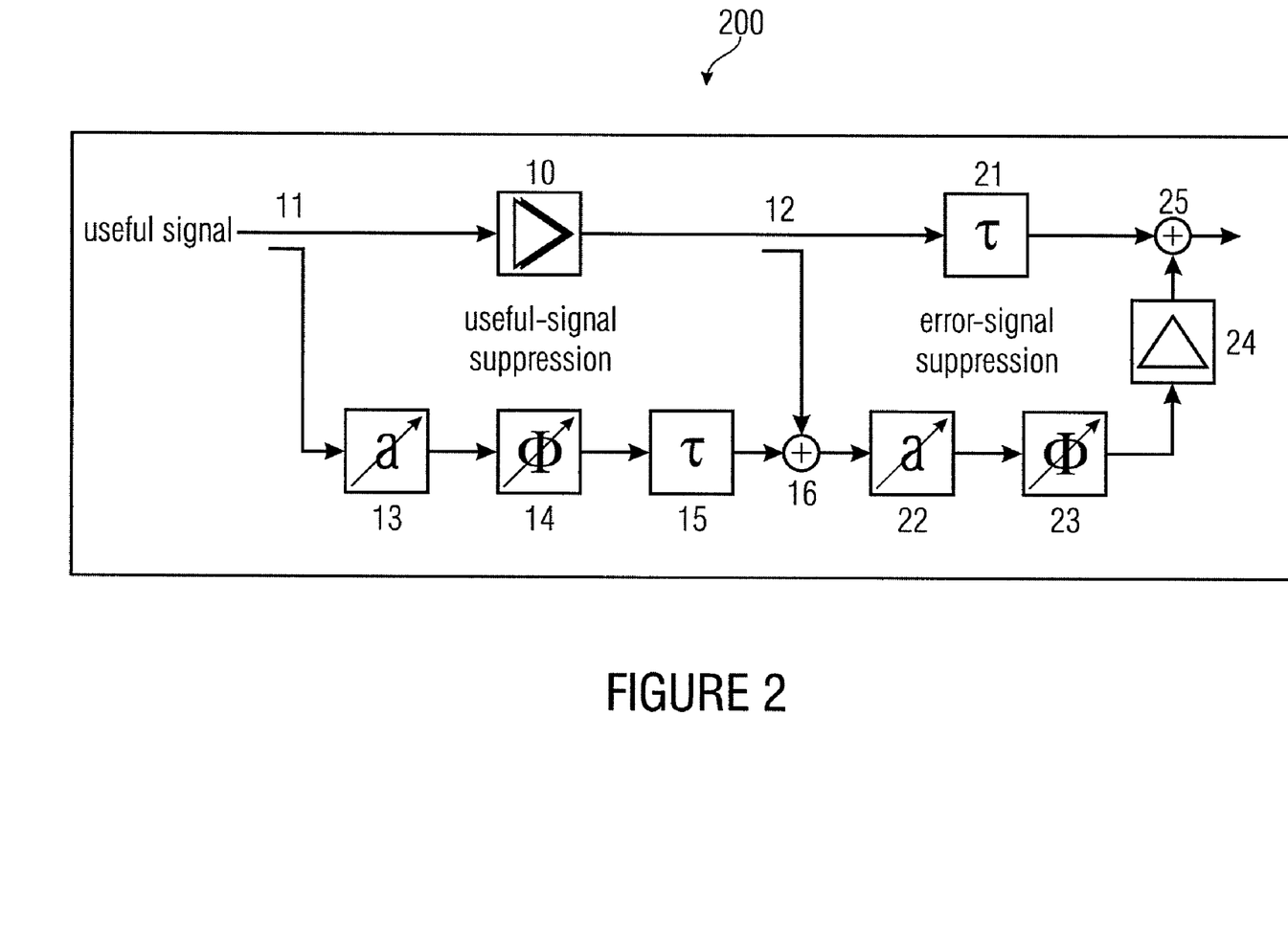
FIG. 2 shows a block diagram of a known apparatus for linearizing an amplifier in accordance with the feedforward principle.

The feedforward method for linearizing amplifiers, for example, has been known for quite some time and has been widely used. FIG. 2 shows a block diagram of a known apparatus 200 for linearizing an amplifier in accordance with the feedforward principle.

An input signal, also referred to as a useful signal below, is applied to the component 10 to be linearized, e.g. an amplifier. Upstream from said component 10, part of the signal is coupled out (as is shown at reference numeral 11), said part serving as a reference signal for useful-signal suppression. Downstream from said component 10, part of the signal is coupled out as well (as is shown at reference numeral 12), said part further being referred to below as an output signal or as a part of the output signal which contains not only the useful signal, but also the portions which are undesired within the component 10, the so-called error signal.

The reference signal is matched, in terms of amplitude (as is shown at reference numeral 13) and phase (as is shown at reference numeral 14), such that at the summation point 16, for example a coupler, said reference signal has the same amplitude and a 180 degrees phase offset as that part of the output signal that was coupled out. To this end, a delay 15, which balances the delay time of the component 10, may also be used.

In the summer 16, also referred to as a combiner, the useful-signal portion is suppressed because of the 180 degrees phase offset. The error signal is maintained since it is contained within only one of the two summed-up signals.

The amplitude (as is shown at reference numeral 22) and the phase (shown above reference numeral 23) of the error signal are matched such that at the summation point 25, for example a directional coupler, said error signal has the same amplitude and a 180 degrees phase offset as the error signal which arrives at the summation point on a direct path from the component 10 via a delayer 21. To this end, an auxiliary amplifier 24 may be used which balances, for example, the losses of the coupler 12 and the summer 25, as well as a delay 21 in the direct path, which balances the delay time of the auxiliary amplifier.

Due to the 180 degrees phase offset, the error signal portion within the output signal is suppressed. The useful signal is maintained since it is contained within only one of the two summed-up paths.

The mode of operation of the feedforward method highly depends on how well the amplitude and the phase of the summed signals may be matched. The better the match between the amplitude and the phase in the summation, the more the undesired signal portion will be suppressed, and the better the entire system will work.

What is also crucial is that no additional spurious signals are generated, for example by non-linear devices within a phase shifter 14, in the reference path of the useful-signal suppression (as is shown at reference numerals 13, 14 and 15). Said spurious signals are not suppressed and appear, in addition to the useful signal, at the output of the feedforward system.

For matching the loops, a phase shifter may be used, for example, by means of which the phase of the signal may be adjusted as accurately as possible. This may be performed, e.g., by analog phase shifters.

One possibility are phase shifters comprising non-linear devices, such as mixers. However, in non-linear devices, harmonics and intermodulations arise which can no longer be removed from the feedforward system.

Another possibility are vector phase shifters, comprised of purely passive devices. Vector phase shifters comprised of purely passive devices create a quadrature signal by means of a passive 90 degrees splitter. The disadvantage is that a 90 degrees splitter has a non-constant group delay time that may be equalized for utilization in a feedforward system.

This is why it is desirable to realize a feedforward system mainly in the digital domain. In this way, it may be possible to implement, e.g., phase shifters in the digital domain. Digital phase shifters may be implemented to be highly accurate and to have a constant group delay time. Thus, the loops may be matched more accurately than in the analog domain, and suppression of the undesired signal portions may be improved accordingly.

Disadvantages of analog phase shifters may be avoided.

Figure 3:
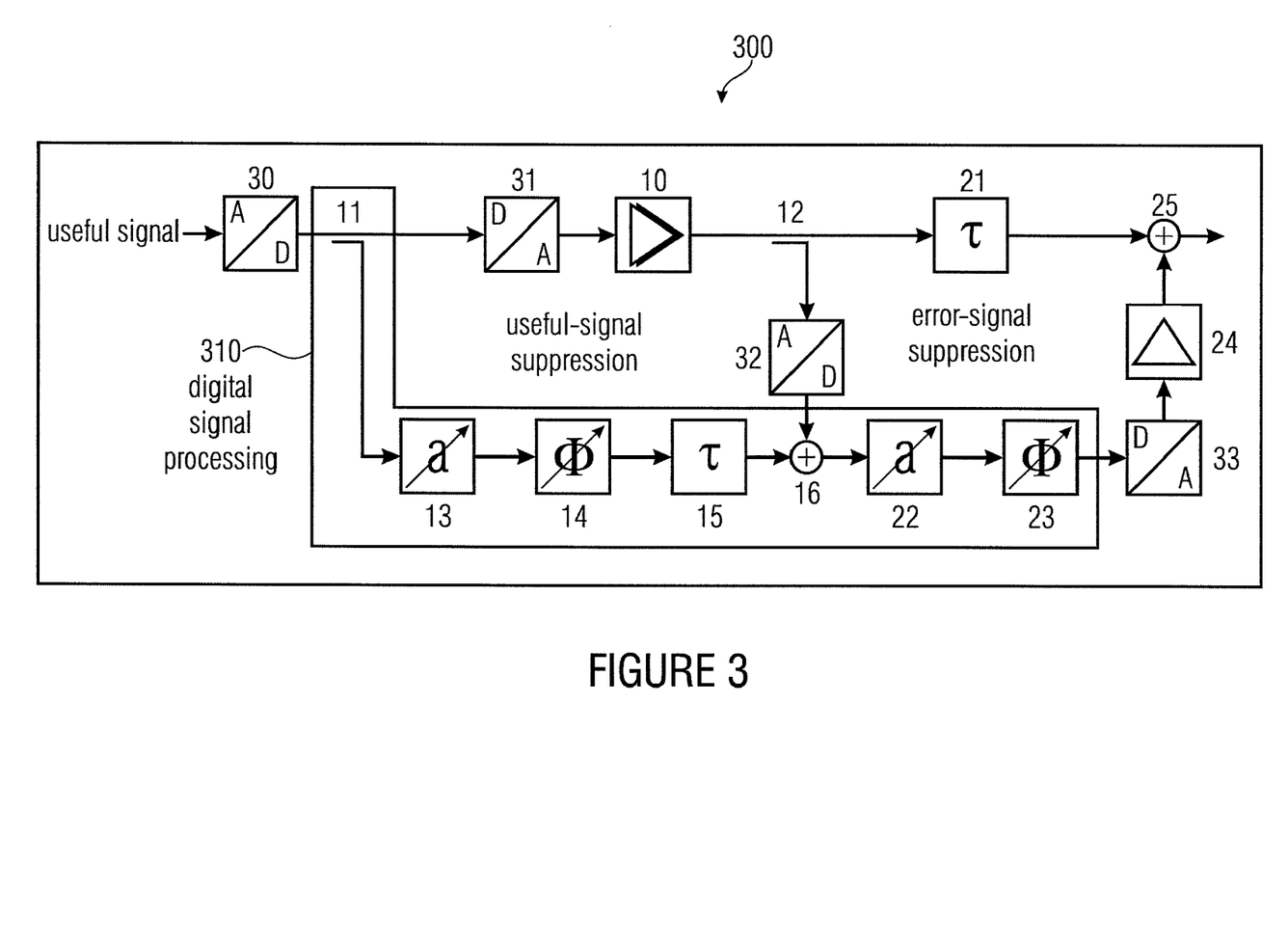
FIG. 3 shows a block diagram of a known apparatus for linearizing an amplifier in accordance with the feedforward principle.

To this end, FIG. 3 shows a block diagram of a known apparatus 300 for linearizing an amplifier in accordance with the feedforward principle. The useful signal or input signal is digitized using an analog-to-digital converter 30. After coupling out the reference signal for useful-signal suppression (as is shown at reference numeral 11) in the digital domain, the signal (input signal) is converted back to being analog using a digital-to-analog converter 31, and is supplied to the component 10.

The setup basically corresponds to the apparatus shown in FIG. 2.

The output signal of the component 10 is coupled out in the analog domain (as is shown at reference numeral 12) and is then digitized using an analog-to-digital converter 32. Thus, the summation 16 for useful-signal suppression may be performed in the digital domain, and the components for matching the amplitude 13 and the phase 14, as well as the signal delay 15, may be realized, in the digital domain, as part of digital signal processing.

Matching of error-signal suppression for the amplitude (as is shown at reference numeral 22) and the phase (as is shown at reference numeral 23) is also performed in the digital domain. Prior to the amplification by the auxiliary amplifier 24, the signal may be converted back to being analog using a digital-to-analog converter 33. The summation for error-signal suppression is performed in the analog domain.

For example, the quality of the analog-to-digital converters and of the digital-to-analog converters plays an important part in this context.

In addition, the area 310 of digital signal processing has been marked in FIG. 3.

Well-known examples of this are also set forth in "Building blocks for wideband powerbank for shipboard HF communication systems, Laske, C.; Ulbricht, G.; Heuberger, A., London: IET, 2006, ISBN: 0863416594, ISBN: 9780863416590, pp. 105-109".

Further well-known examples are set forth in patent documents U.S. Pat. No. 4,389,618, U.S. Pat. No. 4,560,945, U.S. Pat. No. 4,591,6407, U.S. Pat. No. 4,926,134, U.S. Pat. No. 4,926,136, EP 0411180, U.S. Pat. No. 5,157,345, U.S. Pat. No. 5,077,532, U.S. Pat. No. 5,148,117, U.S. Pat. No. 5,300,894, U.S. Pat. No. 544,864, U.S. Pat. No. 5,455,537, U.S. Pat. No. 5,489,875, U.S. Pat. No. 5,789,976, WO 98/04034, U.S. Pat. No. 5,760,646, U.S. Pat. No. 5,862,459, U.S. Pat. No. 5,774,018, U.S. Pat. No. 5,898,338, WO 98/12800, U.S. Pat. No. 5,877,653, U.S. Pat. No. 6,067,448, U.S. Pat. No. 5,994,957, U.S. Pat. No. 6,075,411, U.S. Pat. No. 5,959,500, U.S. Pat. No. 6,078,216, EP 0869606, U.S. Pat. No. 6,531,918, U.S. Pat. No. 6,166,601, EP 0996222, U.S. Pat. No. 6,583,739/WO 01/08293, U.S. Pat. No. 6,392,481, WO 01/41297, U.S. Pat. No. 6,266,517, US 2003/0132802, EP 1124324A1, U.S. Pat. No. 6,275,106, U.S. Pat. No. 6,359,508, EP 1353438, EP 1241781A1. U.S. Pat. No. 6,504,428, U.S. Pat. No. 6,496,064, US 2003/0030490, U.S. Pat. No. 6,407,635, U.S. Pat. No. 6,683,495, EP 1309082, US 2003/0174017, WO03/105337, US 2004/0004516, and US 2003/0184373.

In addition, U.S. Pat. No. 6,188,732 B1 shows a digital feedforward amplifier for utilization in an RF transmitter. The digital feedforward amplifier uses digital signal processing for generating error correction signals, said digital signal processing reducing intermodulation distortions which arise due to the saturation of the main power amplifier.

SUMMARY

According to an embodiment, an apparatus for generating a correction signal for linearizing an output signal of a non-linear element may have: a correction signal generator configured to generate a correction signal on the basis of a superposition of a digital reference signal and a superposed output signal, the superposed output signal being based on a superposition of the output signal and an analog reference signal, the non-linear element being configured to generate the output signal on the basis of an input signal, and the digital reference signal and the analog reference signal being based on the input signal.

According to another embodiment, an apparatus for linearizing an output signal of a non-linear element with an apparatus for generating a correction signal for linearizing an output signal of a non-linear element, wherein the apparatus for generating may have: a correction signal generator configured to generate a correction signal on the basis of a superposition of a digital reference signal and a superposed output signal, the superposed output signal being based on a superposition of the output signal and an analog reference signal, the non-linear element being configured to generate the output signal on the basis of an input signal, and the digital reference signal and the analog reference signal being based on the input signal, wherein the apparatus for linearizing may have: an output signal combiner configured to superpose the output signal with the correction signal so as to linearize the output signal.

According to another embodiment, a method for generating a correction signal for linearizing an output signal of a non-linear element may have the steps of: superposing an analog reference signal and the output signal so as to acquire a superposed output signal; and superposing a digital reference signal with the superposed output signal so as to generate the correction signal, the non-linear element being configured to generate the output signal on the basis of an input signal, and the digital reference signal and the analog reference signal being based on the input signal.

According to another embodiment, a method for linearizing an output signal of a non-linear element may have the steps of: superposing an analog reference signal and the output signal so as to acquire a superposed output signal; superposing a digital reference signal with the superposed output signal so as to generate a correction signal, the non-linear element being configured to generate the output signal on the basis of an input signal, and the digital reference signal and the analog reference signal being based on the input signal; and superposing the correction signal with the output signal so as to generate a linearized output signal.

An embodiment in accordance with the invention provides an apparatus for generating a correction signal for linearizing an output signal of a non-linear element, which apparatus comprises a correction signal generator. The correction signal generator is configured to generate a correction signal on the basis of a superposition of a digital reference signal and a superposed output signal. The superposed output signal is based on a superposition of the output signal with an analog reference signal.

Embodiments in accordance with the invention are based on the core idea that, by means of the superposition of the analog reference signal with the output signal of the non-linear element, analog pre-suppression is performed. It is only thereafter that a superposition with the digital reference signal takes place, it being possible, in the field of digital signal processing, to adapt the superposed output signal and the digital reference signal with a very high level of accuracy, whereby a high-quality correction signal may be generated. By means of analog pre-suppression, the requirements placed upon at least some of the components of digital signal processing may be reduced. As a result, e.g., the cost may be cut, and the quality of the correction signal may be improved.

In some embodiments in accordance with the invention, the analog reference signal and the digital reference signal are generated on the basis of an input signal of the non-linear element. The non-linear element is configured to generate the output signal on the basis of the input signal.

Some embodiments in accordance with the invention provide a method for generating a correction signal for linearizing an output signal of a non-linear element. The method comprises superposing an analog reference signal and the output signal so as to obtain a superposed output signal, and superposing a digital reference signal with the superposed output signal so as to generate the correction signal.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
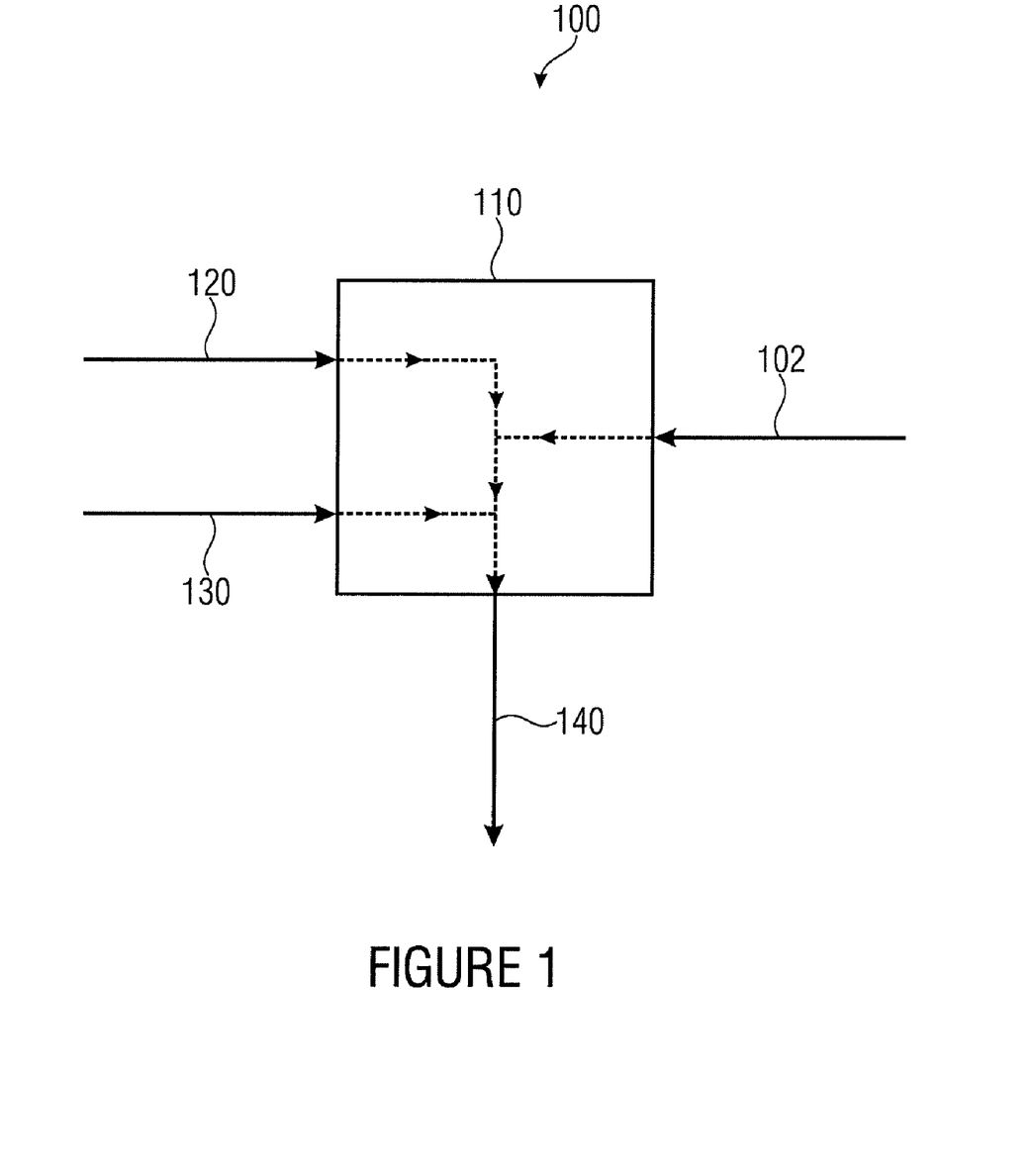
FIG. 1 shows a schematic representation of an apparatus for generating a correction signal.

FIG. 1 shows an apparatus 100 for generating a correction signal 140 for linearizing an output signal 102 of a non-linear element in accordance with an embodiment of the invention. The apparatus 100 comprises a correction signal generator 110, the correction signal generator 110 being configured to generate a correction signal 140 on the basis of a superposition of a digital reference signal 130 and a superposed output signal. The superposed output signal is based on a superposition of the output signal 102 with an analog reference signal 120.

The analog reference signal 120 is superposed with the output signal 102 so as to realize analog pre-suppression. In this context, the analog reference signal 120 may be derived, for example, from an input signal of the non-linear element. Due to the analog pre-suppression in the form of the superposition, the input signal portions within the output signal 102 may be at least partly suppressed. As a result, further processing of the superposed output signal within the digital part of the correction signal generator 110 may be facilitated.

For example, limited dynamics of an analog-to-digital converter, which may be used, for example, for digitizing the (superposed) output signal of the non-linear element, may be better utilized when analog pre-suppression is employed.

The analog reference signal 120 and the digital reference signal 130 may be generated, for example, on the basis of the input signal of the non-linear element. For this purpose, e.g. part of the input signal may be coupled out. Alternatively, the analog reference signal 120 may be generated on the basis of the digital reference signal 130, or the digital reference signal 130 may be generated on the basis of the analog reference signal 120.

The correction signal generator 110 may have the digital reference signal 130 and the analog reference signal 120 provided to it as an input signal, as is shown in FIG. 1, or the correction signal generator 110 may be configured, for example, to generate the digital reference signal 130 and/or the analog reference signal 120 on the basis of, e.g., the input signal of the non-linear element.

The correction signal generator 110 may comprise, for example, an analog-to-digital converter configured to convert the superposed output signal to a digital signal following the analog pre-suppression.

In addition, the correction signal generator 110 may comprise elements for adapting the amplitude, phase and the signal delay time of the various signals. In this manner, a 180 degrees phase offset between the analog reference signal 120 and the output signal 102 as well as between the digital reference signal 130 and the superposed output signal may again be generated in accordance with the feedforward principle.

The correction signal 140 may be used for linearizing the output signal 102 of the non-linear element. Linearizing an output signal is understood to mean, for example, that the linearized output signal will have a more linear characteristic than the original output signal. Undesired signal portions may be at least partly suppressed.

Figure 4:
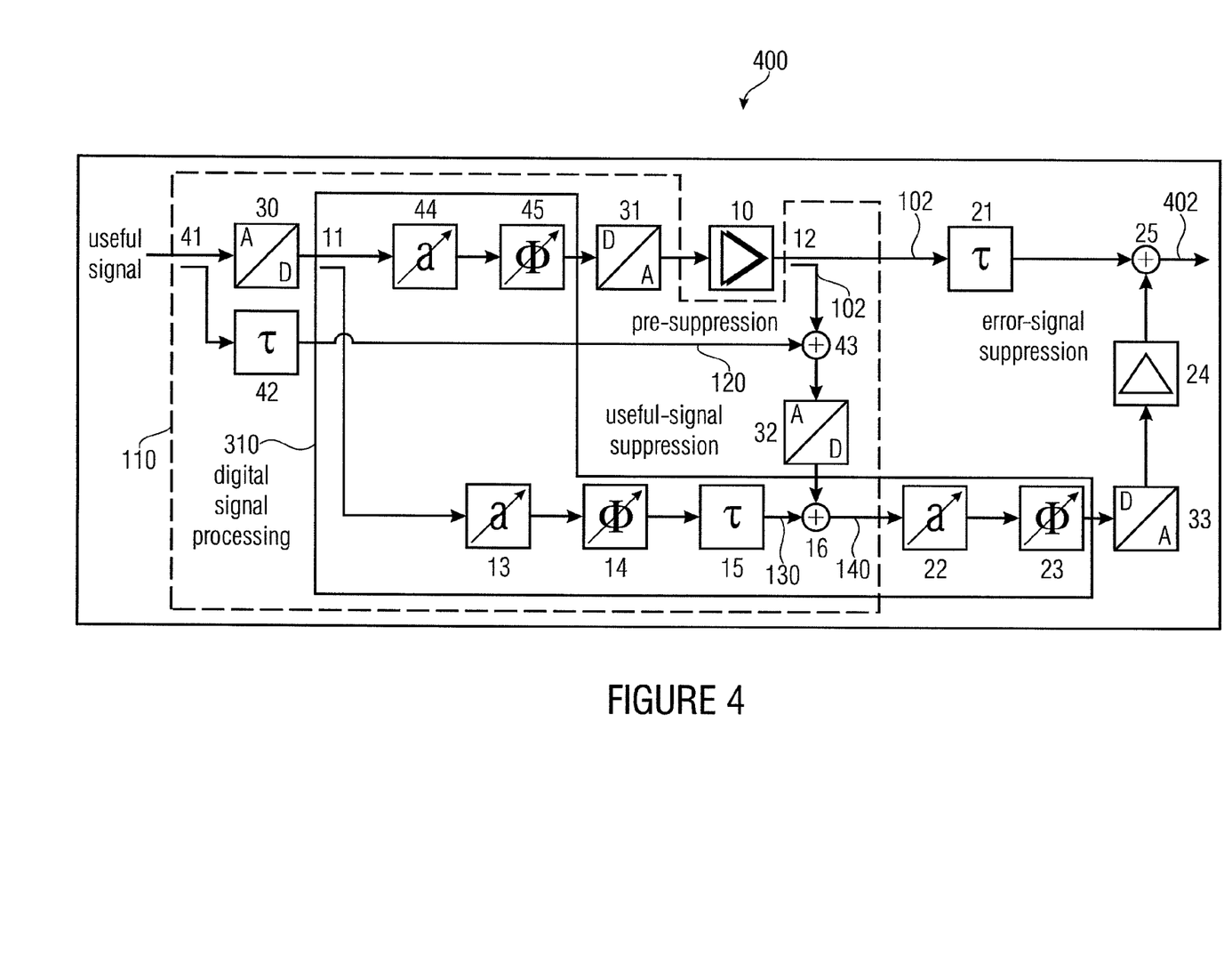
FIG. 4 shows a block diagram of an apparatus for linearizing an output signal of a non-linear element.

FIG. 4 shows a block diagram of an apparatus 400 for linearizing an output signal 102 of a non-linear element 10 in accordance with an embodiment of the invention. The apparatus 400 comprises a correction signal generator 110, elements for adapting the correction signal 140 to the output signal 102, a delayer 21 for adapting a signal delay time of the output signal 102 to a signal delay time of the correction signal 140, and a combiner 25 for superposing the output signal 102 and the correction signal 140 so as to obtain a linearized output signal 402.

The correction signal generator 110 comprises a coupler 41 configured to couple out part of the useful signal (input signal) as an analog reference signal 120. The signal delay time of the analog reference signal 120 may be adapted to the signal delay time of the output signal 102 of the non-linear element 10 by a delayer 42, and the analog reference signal 120 is made available to a combiner 43.

Once the analog reference signal 120 has been coupled out, the input signal is converted to a digital signal by the analog-to-digital converter 30, and is provided to a further coupler 11 configured to couple out part of the input signal as a digital reference signal 130. Subsequently, the amplitude and the phase of the input signal is changed, by a digital amplitude adjuster 44 and a digital phase shifter 45, such that the resulting output signal 102 of the non-linear element 10 is adapted to the analog reference signal 120. Thereafter, the input signal is converted to an analog signal by a digital-to-analog converter 31, and is made available to the non-linear element 10, which will generate the output signal 102 on the basis of the input signal.

In addition, the correction signal generator 110 comprises a coupler 12 configured to couple out part of the output signal 102 of the non-linear element 10 and to make it available to the combiner 43. The combiner 43 is configured to superpose the analog reference signal 120 with the output signal 102 and to make the superposed output signal available to a further combiner 16 once it has been converted to a digital signal by an analog-to-digital converter 32.

The digital reference signal 130 that was previously coupled out is adapted to the superposed output signal by a digital amplitude adjuster 13, a digital phase shifter 14, and a delayer 15, and is made available to the combiner 16. The combiner 16 is configured to superpose the superposed output signal and the digital reference signal 130, and to generate the correction signal 140.

Subsequently, the correction signal 140 may be adapted to the output signal 102 of the non-linear element 10, for example by a further digital amplitude adjuster 22 and a further digital phase shifter 23, and, after having been converted to an analog signal by a digital-to-analog converter 33, by an auxiliary amplifier 24. The elements for adapting the correction signal 120 may alternatively also be part of the correction signal generator 110.

Thus, for example, once it has been coupled out (by the coupler 12), the output signal 102 of the non-linear element 10 is summed, by the combiner 43, with the useful signal (analog reference signal) coupled out by the coupler 41. The amplitude and phase may be matched, in the transmit path (path between the coupler 41 and the non-linear element 10), for example with digital actuators (amplitude adjuster 44 and phase shifter 45), so that both signals (the output signal and the analog reference signal) have identical amplitudes and, as far as possible, and a 180 degrees phase offset, if possible, at the summation point (combiner 43). The delay time caused by the non-linear element 10 may be balanced by means of a delay (on the part of the delayer 42).

Due to the phase offset of 180 degrees, the useful-signal portion is suppressed within the combiner 43. Thus, for example, the requirements placed upon the dynamics of the analog-to-digital converter 32 may be reduced proportionately to the amount of suppression within the combiner 43.

Useful-signal suppression is thus realized, on the one hand, by the analog pre-suppression on the part of the combiner and by the second superposition on the part of the combiner 16. Error-signal suppression may be performed later on by the combiner 25.

In addition, the area 310 of digital signal processing has been marked in FIG. 4.

Figure 5:
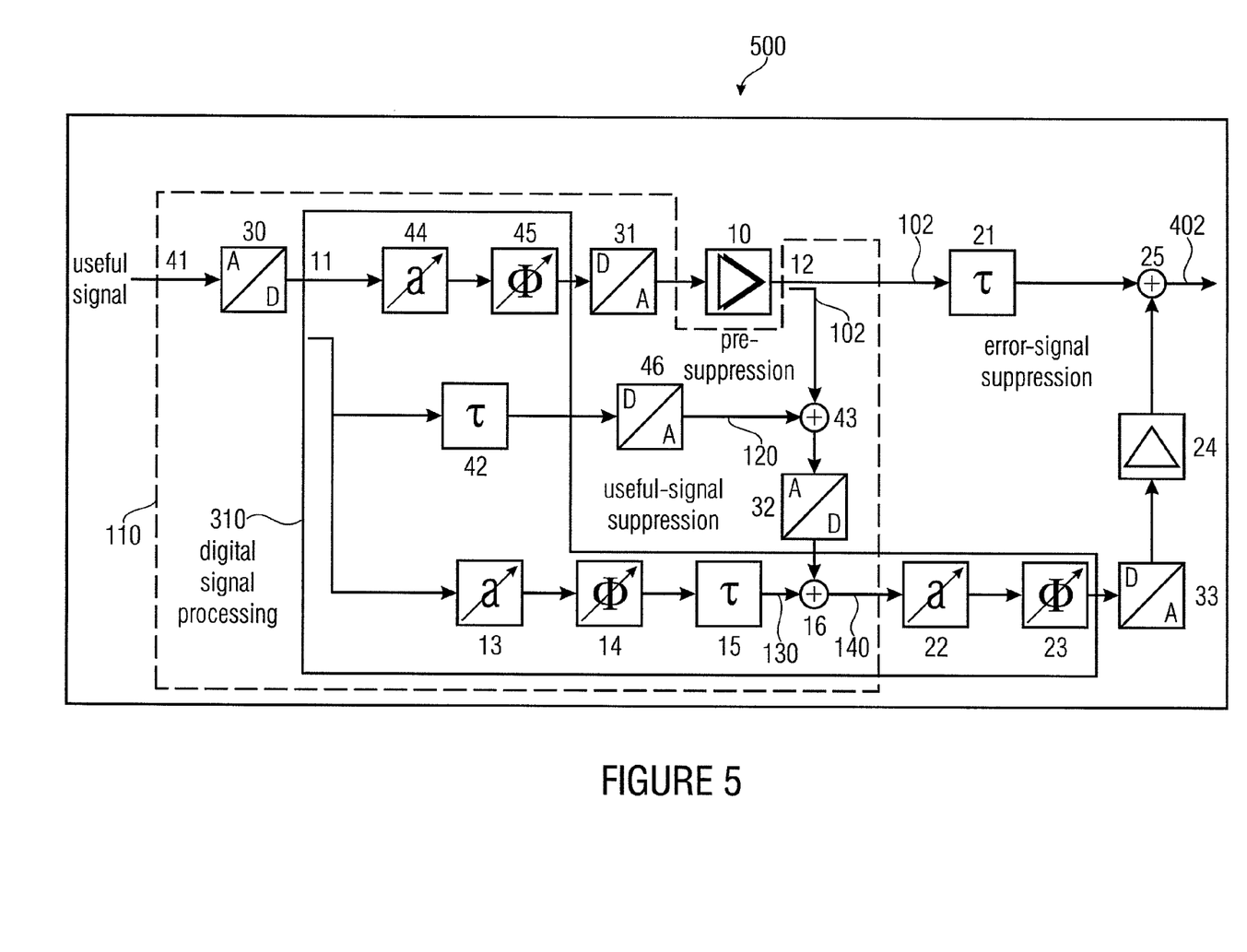
FIG. 5 shows a block diagram of a further apparatus for linearizing an output signal of a non-linear element.

FIG. 5 shows a block diagram of a further apparatus 500 for linearizing an output signal 102 of a non-linear element 10 in accordance with an embodiment of the invention. Basically, the apparatus corresponds to the apparatus shown in FIG. 4. However, the (analog) reference signal for pre-suppression is obtained by a coupler 11 in the digital domain rather than by a dedicated coupler 41 in the analog domain (just like the digital reference signal). In this case, the (analog) reference signal is converted, prior to the superposition or summation, to being analog by using a digital-to-analog converter 46. Then the delay (the delayer 42) may be implemented in the digital domain, and the match (using the amplitude adjuster 44 and the phase shifter 45) could also take place in the reference path (path in which the analog reference signal gets to the combiner 43) rather than in the transmit path (path via which the input signal gets to the non-linear element).

Figure 6:
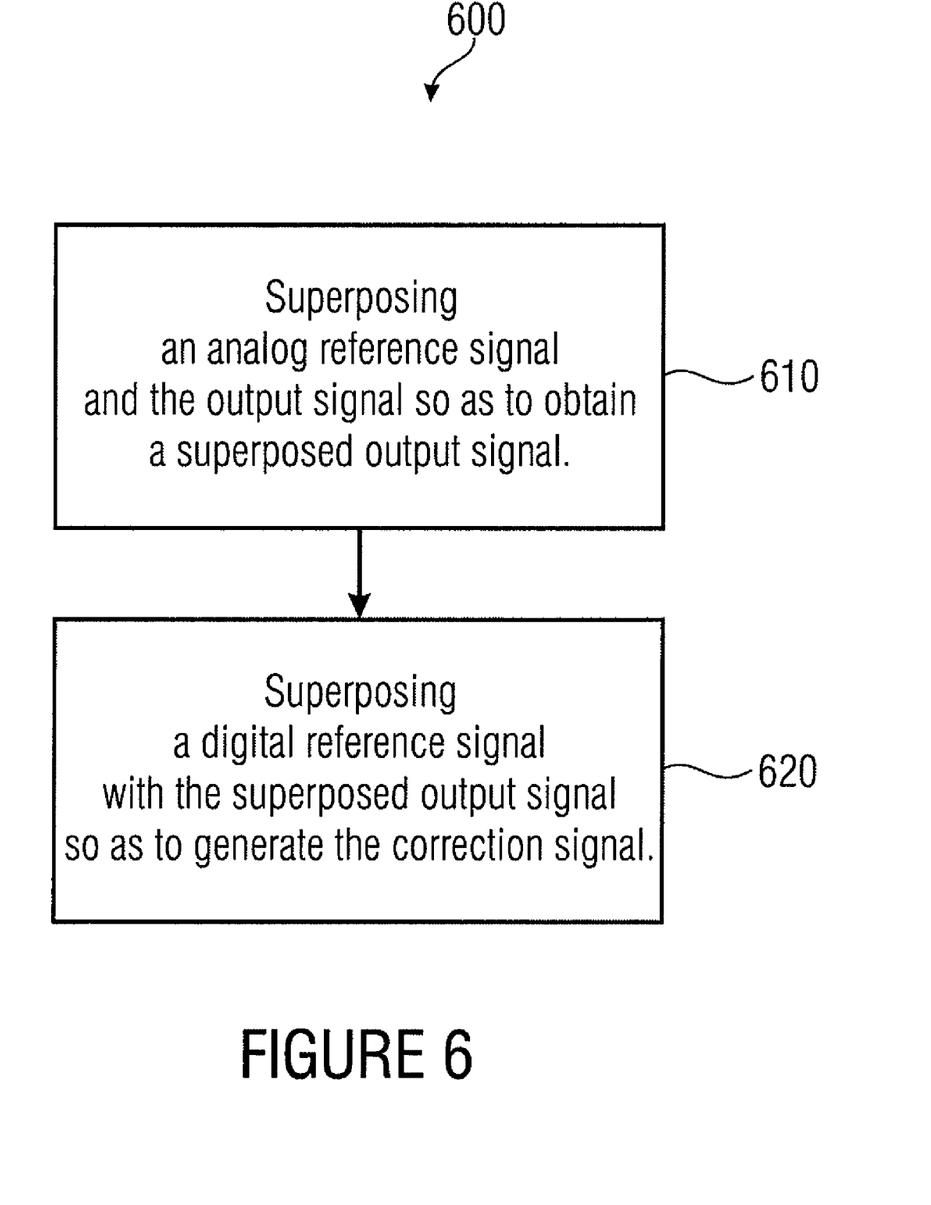
FIG. 6 shows a flowchart of a method for generating a correction signal for linearizing an output signal of a non-linear element.

FIG. 6 shows a flowchart of a method 600 of generating a correction signal for linearizing an output signal of a non-linear element in accordance with an embodiment of the invention. The method 600 comprises superposing 610 an analog reference signal and an output signal so as to obtain a superposed output signal, and superposing 620 a digital reference signal with the superposed output signal so as to generate the correction signal.

Some embodiments in accordance with the invention relate to an apparatus wherein the requirements placed upon analog-to-digital converters may be reduced by means of performing analog pre-suppression of the useful signal (input signal), wherein the match is performed in the digital domain, or, alternatively, in the analog domain.

Further embodiments of the invention relate to an apparatus for suppressing undesired signal portions in accordance with the feedforward principle, wherein a large part of the signal processing, for example for the match, is performed as digital signal processing by using analog-to-digital converters and digital-to-analog converters.

By implementing phase shifters and amplitude adjusters in the digital domain, it is possible to match the loops more accurately than with analog actuators, and the matching accuracy may thus be improved.

Disadvantages of analog actuators such as non-constant group delay time and non-linearities may be avoided.

In addition to the actuators, further components may be implemented, in digital signal processing, which may improve the system properties and functionality. They include, for example, digital filters with which the frequency response of the loops may be equalized.

In addition, implementing digital actuators involves clearly less expenditure than designing and controlling analog actuators.

Implementation in the digital domain is reconfigurable in a simple manner and therefore enables a degree of flexibility than cannot be achieved with analog components.

In the present application, identical reference numerals are sometimes used for objects and functional units comprising identical or similar functional, properties.

The term output signal of the non-linear element is used both for the direct output signal of the non-linear element and, for example, for a part of the output signal that has been coupled out and that is superposed with the analog reference signal.

The principle described is independent of the type of the non-linear element. For example, the components of the apparatus may be adapted to the respective requirements such as the frequency range, for example.

In particular, it shall be noted that, depending on the circumstances, the inventive scheme may also be implemented in software. Implementation may be on a digital storage medium, in particular a disk or CD with electronically readable control signals which may interact with a programmable computer system such that the respective method is performed. Generally, the invention thus also consists in a computer program product with a program code, stored on a machine-readable carrier, for performing the inventive method, when the computer program product runs on a computer. In other words, the invention may thus be realized as a computer program having a program code for performing the method, when the computer program product runs on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus for generating a correction signal for linearizing an output signal of a non-linear element, comprising:
   a correction signal generator configured to generate a correction signal on the basis of a superposition of a digital reference signal and a superposed output signal, the superposed output signal being based on a superposition of the output signal and an analog reference signal, the non-linear element being configured to generate the output signal on the basis of an input signal, and the digital reference signal and the analog reference signal being based on the input signal.

2. The apparatus for generating a correction signal as claimed in claim 1, comprising an analog-to-digital converter, the analog-to-digital converter being configured to convert the superposed output signal to a digital signal.

3. The apparatus for generating a correction signal as claimed in claim 1, comprising a first combiner and a second combiner, the first combiner being configured to superpose the analog reference signal with the output signal so as to acquire the superposed output signal, and the second combiner being configured to superpose the digital reference signal with the superposed output signal so as to acquire the correction signal.

4. The apparatus for generating a correction signal as claimed in claim 1, further comprising:
   a digital amplitude adjuster configured to adapt an amplitude of the digital reference signal to an amplitude of the superposed output signal;
   a digital phase shifter configured to adapt a phase of the digital reference signal to a phase of the superposed output signal; and
   a digital delayer configured to adapt a signal delay time of the digital reference signal to a signal delay time of the superposed output signal.

5. The apparatus for generating a correction signal as claimed in claim 1, comprising a further digital amplitude adjuster and a further digital phase shifter, the further digital amplitude adjuster being configured to adapt an amplitude of the input signal and, thus, an amplitude of the output signal to an amplitude of the analog reference signal, and the further digital phase shifter being configured to adapt a phase of the input signal and, thus, a phase of the output signal to a phase of the analog reference signal.

6. The apparatus for generating a correction signal as claimed in claim 1, comprising a coupler and a digital-to-analog converter, the coupler being configured to couple out part of the input signal and to provide it as the digital reference signal, and the digital-to-analog converter being configured to generate the analog reference signal on the basis of the digital reference signal.

7. The apparatus for generating a correction signal as claimed in claim 6, comprising a digital delayer, the digital delayer being configured to adapt a signal delay time of the analog reference signal to a signal delay time of the output signal.

8. The apparatus for generating a correction signal as claimed in claim 1, comprising a first coupler and a second coupler, the first coupler being configured to couple out part of the input signal and to provide it as the analog reference signal, the second coupler being configured to couple out part of the input signal and to provide it as the digital reference signal, the input signal between the first coupler and the second coupler being converted from an analog signal to a digital signal by an analog-to-digital converter.

9. The apparatus for generating a correction signal as claimed in claim 8, comprising an analog delayer, the analog delayer being configured to adapt a signal delay time of the analog reference signal to a signal delay time of the output signal.

10. An apparatus for linearizing an output signal of a non-linear element with an apparatus for generating a correction signal for linearizing an output signal of a non-linear element, the apparatus for generating comprising:
a correction signal generator configured to generate a correction signal on the basis of a superposition of a digital reference signal and a superposed output signal, the superposed output signal being based on a superposition of the output signal and an analog reference signal, the non-linear element being configured to generate the output signal on the basis of an input signal, and the digital reference signal and the analog reference signal being based on the input signal, the apparatus for linearizing comprising:
an output signal combiner configured to superpose the output signal with the correction signal so as to linearize the output signal.

11. The apparatus for linearizing an output signal of a non-linear element as claimed in claim 10, comprising a delayer configured to adapt a signal delay time of the output signal to a signal delay time of the correction signal.

12. The apparatus for linearizing an output signal of a non-linear element as claimed in claim 10, further comprising:
a digital amplitude adjuster configured to adapt an amplitude of the correction signal to an amplitude of the output signal;
a digital phase shifter configured to adapt a phase of the correction signal to a phase of the output signal;
an amplifier configured to adapt the correction signal to the output signal.

13. A method for generating a correction signal for linearizing an output signal of a non-linear element, comprising:
superposing an analog reference signal and the output signal so as to acquire a superposed output signal; and
superposing a digital reference signal with the superposed output signal so as to generate the correction signal, the non-linear element being configured to generate the output signal on the basis of an input signal, and the digital reference signal and the analog reference signal being based on the input signal.

14. A method for linearizing an output signal of a non-linear element, comprising:
superposing an analog reference signal and the output signal so as to acquire a superposed output signal;
superposing a digital reference signal with the superposed output signal so as to generate a correction signal, the non-linear element being configured to generate the output signal on the basis of an input signal, and the digital reference signal and the analog reference signal being based on the input signal; and
superposing the correction signal with the output signal so as to generate a linearized output signal.

* * * * *